US005780971A

United States Patent [19]

Dawson et al.

[11] Patent Number: 5,780,971

[45] Date of Patent: Jul. 14, 1998

[54] METHOD AND APPARATUS FOR GENERATING RADIATION UTILIZING DC TO AC CONVERSION WITH A CONDUCTIVE FRONT

[75] Inventors: John M. Dawson, Pacific Palisades; Warren B. Mori, Hermosa Beach; Chih-Hsiang Lai, So. Pasadena; Thomas C. Katsouleas, Malibu, all of Calif.

[73] Assignees: Univ. of So. Calif., Los Angeles; The Regents of the Univ. Univ. of Calif., Oakland, both of Calif.

[21] Appl. No.: 254,410

[22] Filed: Jun. 6, 1994

[51] Int. Cl.$^6$ .............................. H03B 7/10; H03B 17/00

[52] U.S. Cl. ............................ 315/39; 331/94.1; 327/301

[58] Field of Search .................................. 315/39; 330/4; 331/94.1; 327/301; 359/240

[56] References Cited

U.S. PATENT DOCUMENTS

| | | | |
|---|---|---|---|
| 3,248,666 | 4/1966 | Farmer | 330/4 X |
| 3,257,620 | 6/1966 | Roberts | 330/4 |
| 3,609,570 | 9/1971 | Gould | 330/4 |
| 4,656,430 | 4/1987 | Olson | 315/39 X |
| 4,975,655 | 12/1990 | Dawson et al. | 330/4.3 |

OTHER PUBLICATIONS

A. K. Ganguly et al.; "Linear theory of a field–emitter–array distributed amplifier", *J. Appl. Phys.* 67 (11), pp. 7098–7110, Jun. 1990.

T. Katsouleas et al.; "A DC To Optical Frequency Converter Based On Plasma Ionization", Abstract, Distributed on Jun. 6, 1994.

D. You et al.; "Generation of high–power sub–single–cycle 500–fs electromagnetic pulses", *Optics Letters*, vol. 18, No. 14; pp. 290–292 Feb. 15, 1993.

Henry L. Bertoni et al.; *Ultra–Wideband, Short–Pulse Electromagnetics*, ed. by H. Bertoni, et al., (Weber Research Institute, Plenum Press ● New York, 1993).

M. B. Ketchen et al.; "Generation of subpicosesond electrical pulses on coplanar transmission lines", *Appl.Phys. Lett.*, 48 (12), 24 Mar. 1986.

V. I. Semenova; "Reflection of Electromagnetic Waves From An Ionization Front", *Radiophysics and Quantum Electronics*, vol. 10, No. 8; pp. 599–604, 1967.

Martin Lampe et al.; "Interaction of electromagnetic waves with a moving ionization front", *Phys. Fluids* 21 (1), pp. 42–54, Jan. 1978.

W. B. Mori; "Generation of turntable radiation using an underdense ionization front", *Physical Review A*, vol. 4, No. 8; pp. 5118–5121, 15 Oct. 1991.

R. L . Savage, Jr., et al.; "Frequency Upshifting and Pulse Compression via Underdense Relativistic Ionization Fronts", *IEEE Transactions on Plasma Science*, vol. 21, No. 1, pp. 5–19, Feb. 1993.

R. L. Savage, Jr., et al.; "Frequency Upconversion of Electromagnetic Radiation upon Transmission into an ionization Front", *Physical Review Letters*, vol. 68, No. 7, pp. 946–949, 17 Feb. 1992.

Eli Yablonovitch; "Spectral Broadening in the Light Transmitted through a Rapidly Growing Plasma", *Physical Review Letters*, vol. 31, No. 14, pp. 877–879, 1 Oct. 1973.

(List continued on next page.)

*Primary Examiner*—Benny T. Lee

*Attorney, Agent, or Firm*—Fulwider Patton Lee & Utecht, LLP

[57] ABSTRACT

Method and apparatus for generating radiation of high power, variable duration and broad tunability over several orders of magnitude from a laser-ionized gas-filled capacitor array. The method and apparatus convert a DC electric field pattern into a coherent electromagnetic wave train when a relativistic ionization front passes between the capacitor plates. The frequency and duration of the radiation is controlled by the gas pressure and capacitor spacing.

34 Claims, 2 Drawing Sheets

OTHER PUBLICATIONS

Eli Yablonovitch; "Self–Phase Modulation of Light in a Laser–Breakdown Plasma", *Physical Review Letters*, vol. 32, No. 20, pp. 1101–1104, May 20, 1974.

Wm. M. Wood et al.; "Measurement of Femtosecond Ionization Dynamics of Atmospheric Density Gases by Spectral Blueshifting", *Physical Review Letters*, vol. 67, No. 25, pp. 3523–3526, 16 Dec. 1991.

S. C. Wilks, et al.; "Photon Accelerator", *Physical Review Letters*, vol. 62, No. 22, pp. 2600–2603, 29 May 1989.

D. K. Kalluri; "Frequency Shifting Using Magnetoplasma Medium: Flash Ionization", *IEEE Transactions on Plasma Science*, vol. 21, No. 1, pp. 77–81, Feb. 1993.

C. H. Lai et al;"Frequency Upshifting by an Ionization Front in a Magnetized Plasma", *IEEE Transactions on Plasma Science*, vol. 21, No. 1, pp. 45–52, Feb. 1993.

E. Esarey et al; "Frequency up–shifting of laser pulses by copropagating ionization fronts", *Physical Review A*, vol. 44, No. 6, pp. 3908–3911, 15 Sep. 1991.

V. B. Gildenburg et al; "Adiabatic Frequency Up–Conversion of a Powerful Electromagnetic Pulse Producing Gas Ionization", *IEEE Transactions on Plasma Science*, vol. 21, No. 1, pp. 34–44, Feb. 1993.

O. G. Zagorodnov et al; "Reflection of Electromagnetic Waves From A Plasma Moving in Slow–Wave Guides", *Soviet Physics JetP*, vol. 11, No. 1, pp. 4–5, Jul. 1960.

S. C. Wilkes et al.; "Frequency Up–Conversion of Electromagnetic Radiation with Use of an Overdense Plasma", *Physical Review Letters*, vol. 61, No. 3, pp. 337–340 18 Jul. 1988.

T. Katsouleas, et al.; Abstract entitled; "A DC to AC Light Converter Based on a laser Ionized Capacitator Array", Program of the 1993 Annual Meeting of the Division of Plasma Physics, *Bulletin of the American Physical Society*, vol. 38, No. 1m p. 1964, Nov. 1993.

D. Auston; "Ultrafast Optoelectronics", *Ultrashort Laser Pulses*, Ch. 5, W. Kaiser ed. (Springer–Verlog, N.Y. 1993).

FIG. 3
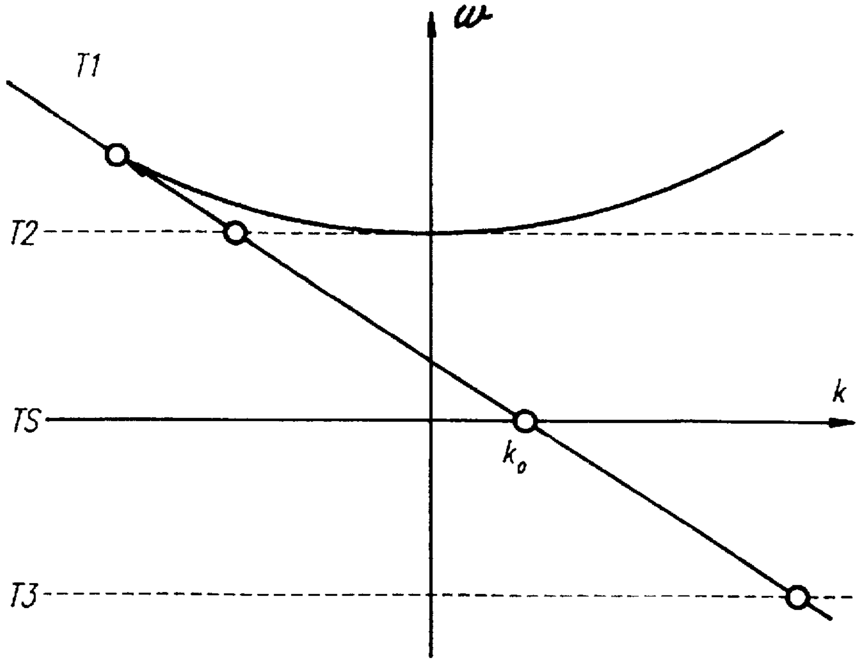
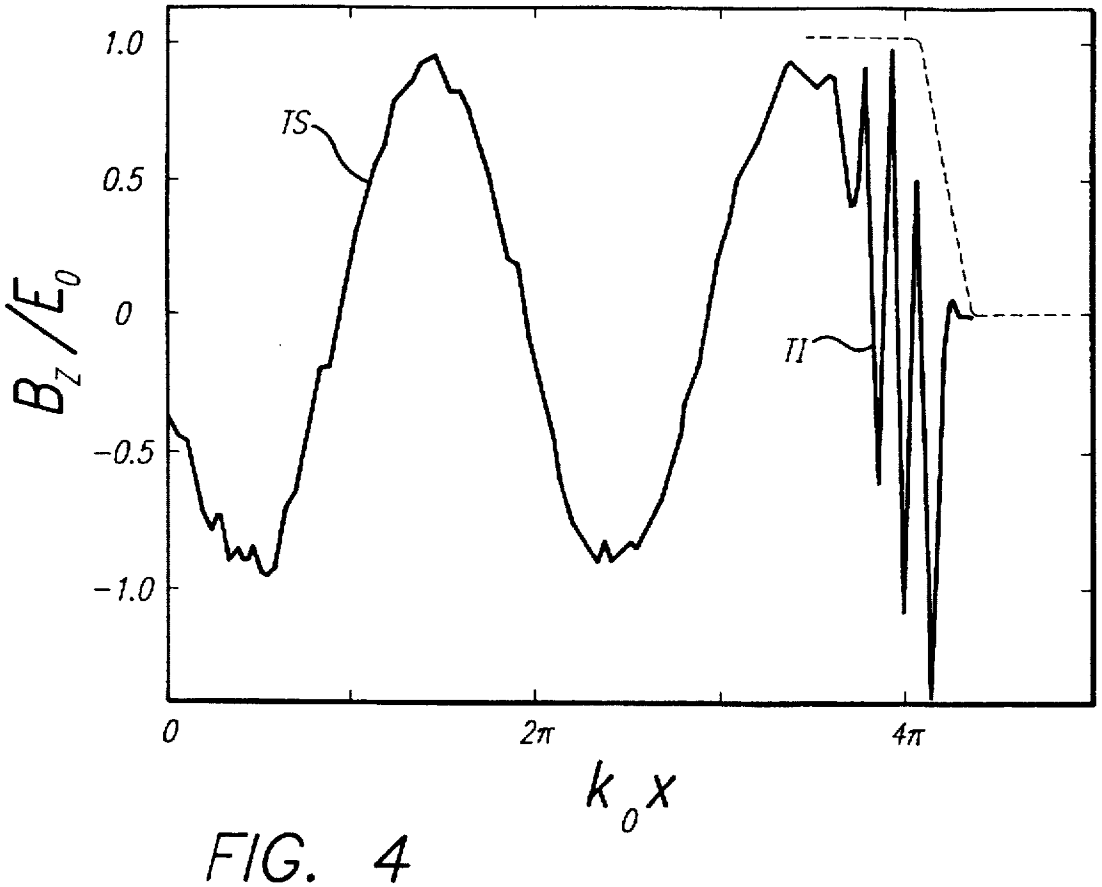
FIG. 4

METHOD AND APPARATUS FOR GENERATING RADIATION UTILIZING DC TO AC CONVERSION WITH A CONDUCTIVE FRONT

STATEMENT OF GOVERNMENT INTEREST

The invention described herein was made in course of or under a contract or subcontract with the United States Department of Energy.

BACKGROUND OF THE INVENTION

1. Field of the Invention

This invention relates generally to improvements in methods and apparatus for generating radiation and, more particularly, to a new and improved method and apparatus for generating radiation of high power, variable duration and shape, and broad tunability.

2. Description of the Prior Art

Radiation sources play important roles in diverse applications ranging from biological and chemical imaging to lithography, medicine (radiation therapy), heating of tokamaks and advanced radar. Many of the high power radiation sources that exist today are either free electron sources—such as FEL's, gyrotrons or synchrotrons that use high power electron beams—or laser/maser sources that are based on photon emission due to transitions between quantum states. Free electron sources generally are expensive and located at large user facilities. Laser sources are more readily available but they normally operate in limited frequency ranges. Recently, alternate sources based on direct conversion of electric fields to light have been attained in vacuum devices and in photo-switched semiconductors. However, the vacuum devices tend to be limited to microwave frequencies, while in the semiconductor devices, the electron-hole carrier concentration and frequency have limited controllability. The use of laser-produced ionization fronts have been successfully employed to upshift existing microwave radiation from 30 GHz to over 150 GHz by a mechanism described alternatively as phase modulation in a time-varying medium or photon acceleration in a plasma. However, these ionization devices utilize both a high-power laser to produce an ionization front and a lower frequency radiation source of high power to be upshifted.

A need exists for an improved method and apparatus for producing tunable bursts of radiation of high power and variable duration over a wide range of frequencies, which are simple and relatively low in cost, and which can be broadly controlled to produce a variety of radiation waveforms. The present invention fulfills all of those needs.

SUMMARY OF THE INVENTION

Briefly, and in general terms, the present invention provides a new and improved method and apparatus for generating bursts of high power radiation that is tunable over a wide range of the electromagnetic spectrum in pulses of variable duration and shape with the capability for arbitrary signal encoding and the application of characteristic signal signatures. The apparatus is simple and compact, and relatively inexpensive.

In one embodiment, short pulses of radiation, tunable by four orders of magnitude from the microwave to the ultraviolet range of frequencies, are provided with high peak powers. The waveforms have selective shape and may be produced with arbitrary frequency versus time and amplitude versus time signatures, chirping, and signal encoding with missing peaks and wave periods.

More specifically, and in a presently preferred embodiment, by way of example and not necessarily by way of limitation, the method and apparatus are utilized to produce radiation by propagating an ionization front through a gas-filled capacitor array that is biased to produce a static electric field of wavenumber $k_o$ and zero frequency. The arrangement acts as a DC to AC converter, upshifting the frequency of the static electric field to produce radiation of variable wavelength and shape controlled by the gas pressure and the configuration of the electric field produced by the capacitor array. Power is controlled by the potential across the capacitor plates.

Other features and advantages of the invention will become apparent from the following detailed description, taken in conjunction with the accompanying drawings, which will illustrate, by way of example, the features of the present invention.

BRIEF DESCRIPTION OF THE DRAWINGS

FIG. 3 is a graphical representation of a dispersion curve for wave propagation through the plasma in the radiation source of FIG. 1, intersected by a line of constant phase;

FIG. 4 is a graphical representation of the results of a two-dimensional particle-in-cell simulation of $B_z/E_o$ and plasma density $n/n_{max}$ versus $k_o x$ for a continuous front located at position $k_o x=13.8$ and length $0.4/k_o$ for the geometry of FIG. 1.

DESCRIPTION OF THE PREFERRED EMBODIMENT

Figure 1:
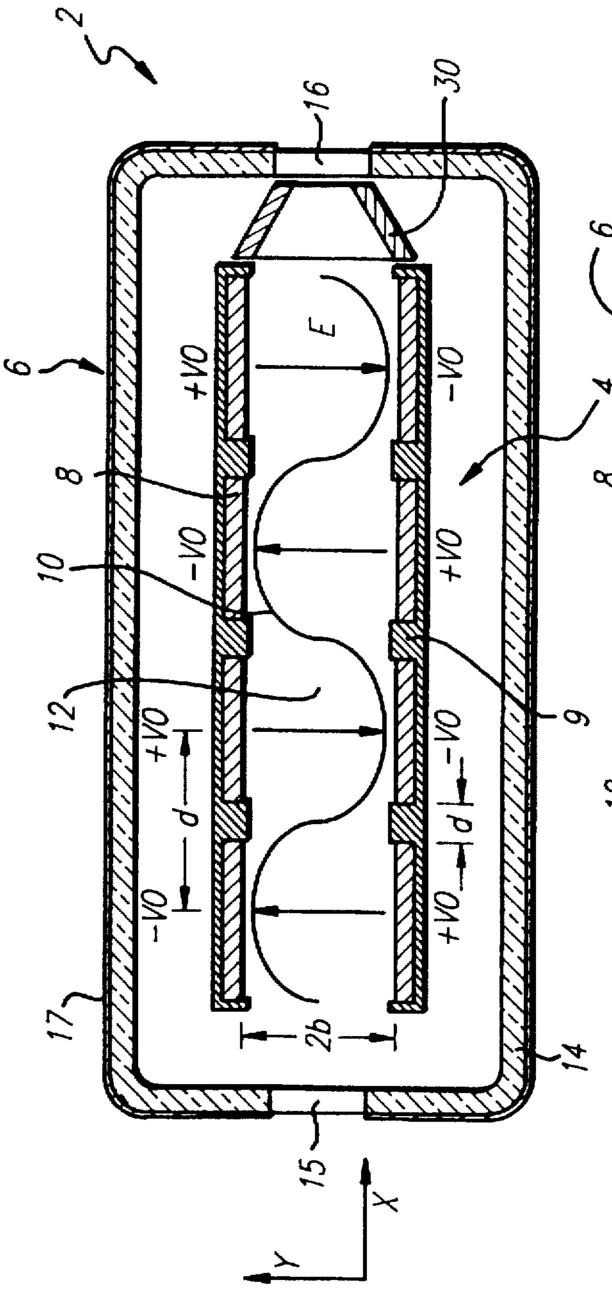
FIG. 1 is a schematic representation of the geometry of a radiation source embodying the novel features of the present invention, showing the source prior to application of an ionizing laser pulse.

Referring now to the drawings, and more particularly to FIG. 1, there is shown a generalized schematic representation of one embodiment of a high power radiation source embodying novel features of the present invention.

The illustrated radiation source, indicated generally by reference number 2, includes a linear array 4 of alternating capacitors housed within a sealed containment vessel 6. Each capacitor within the array includes a pair of oppositely charged capacitor plates 8 separated by a distance 2b. Adjacent capacitors in the array are separated from each other by a distance d, as measured between the centers of the capacitor plates 8, and by a distance δ, as measured between the edges of adjacent plates 8.

A variety of parameters can be used in the construction of the radiation source 2. For example, in one embodiment, the distance d between the centers of the capacitor plates 8 is the range of about 4.7 cm to 300μ, the distance δ is in the range of about 0.01 d to d, and the spacing 2b between the plates 8 in each capacitor is in the range of about 0.1 d to 3.0 d. The number of capacitors within the array 4 can be varied over a wide range, with 1 to 100 capacitors being typical. The overall length of the array 4 is determined by the number of capacitors in the array and by the spacing d between the centers of adjacent capacitors plates 8.

Each of the capacitor plates 8 within the array 4 is connected to a voltage source $V_o$ (not shown) or ground. The voltage source $V_o$ produces a bias voltage ($+V_o$, $-V_o$) across each capacitor, with adjacent capacitors being charged with opposite polarity. Typically, the bias voltage is in the range of 1–30 kV. A dielectric material 9, such as glass or high temperature plastic, e.g., "Kel-F", is disposed in the region δ between the capacitor plates 8 to prevent arcing across adjacent plates 8. The material extends inwards slightly beyond the inner surface of the capacitor plates 8 and, in addition, extends across the back of the plates 8 to provide a support structure.

The charged capacitor array 4 produces a static DC electric field E in the area between the capacitor plates 8. The form of the field is determined by the pattern and arrangement of the capacitors within the array and by their relative levels of charge, and these elements can be selectively varied in order to produce a field of desired form. In the embodiment of FIG. 1, the capacitors are evenly spaced and identically charged (with adjacent capacitors having opposite polarity) to produce a static electric field 10 with an undulating, generally sinusoidal, variation in amplitude along the length of the capacitor array 4.

The area between the capacitor plates 8 is filled with a low density working gas 12 of a type which can be ionized. Typical examples of a suitable working gas include azulene, diethyl aniline, hydrogen, helium and carbon monoxide. The gas is confined under pressure within the containment vessel 6 which surrounds and encloses the capacitor array 4. In a typical example, the containment vessel 6 is a cylindrical glass tube 14 with a quartz window 15, 16 at each end, as visible in FIGS. 1 and 2. Different window materials may be used depending upon the particular range of wavelengths intended for the radiation source 2. The material should be chosen to easily transmit the desired wavelength of radiation with minimal distortion and interference. The containment vessel 6 provides a sealed environment for containing the working gas 12 under pressures ranging from about 0.1 milliTorr to 10 Torr in exemplary embodiment described above. The vessel 6 is wrapped with a layer 17 of metal foil, such as aluminum foil or copper foil, in order to reduce losses of radiation from the sides of the tube 14.

Figure 2:
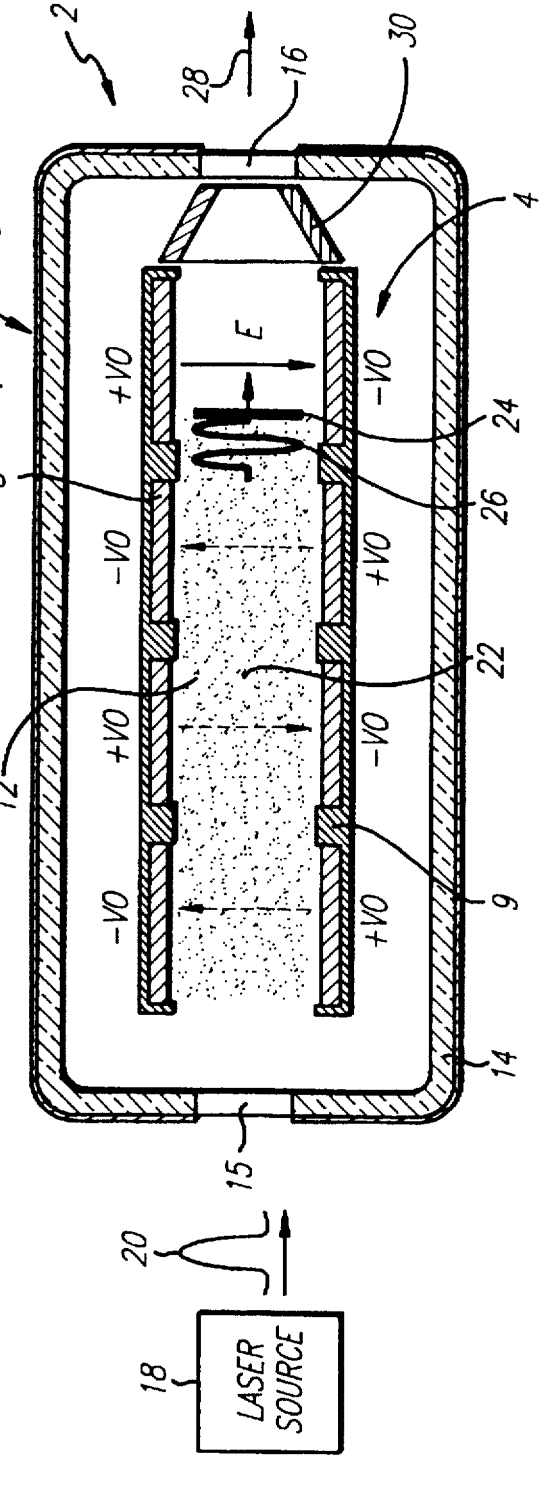
FIG. 2 is a schematic representation of the radiation source of FIG. 1, during application of an ionizing laser pulse.

The operation of the radiation source 2 can best be understood by reference to FIG. 2. A laser source 18 positioned outside the tube 14 directs short bursts of laser light 20 through the window 15 at one end of the containment vessel 6. The laser light 20 propagates down the length of the capacitor array 4, travelling in the reference x direction indicated in FIG. 1. A short pulse, high power laser, such as an Nd:Glass, Nd:Yag or Ti:Sapphire laser, with a wavelength in the range of about 0.25μ to 1.0μ and a pulse length in the range of about 0.2 mm to 15 mm is suitable for this purpose.

The laser pulse 20 interacts with the working gas 12 in the area between the capacitor plates 8 and converts the gas into an ionized plasma or charged gas 22. The plasma 22 is created behind a moving ionization front 24 formed as the laser pulse propagates through the static electric field 10 (see FIG. 1) down the length of the capacitor array 4. The plasma 22 is electrically conductive, so that it causes current to flow between the capacitor plates 8. This phased discharge current across the capacitor array 4 generates a radiation pulse 26 behind the ionization front 24. The waveform of the radiation pulse 26 generally mimics the configuration of the static DC electric field 10 (e.g., sinusoidal in the present example). However, the present arrangement frequency upshifts the static field 10 by temporally varying the dielectric properties of the gaseous medium, i.e., by ionizing the working gas 12 in a time varying fashion. Output radiation 28 in the form of the radiation pulse 26 is emitted from the source 2 through the window 16 at the end of the array 4 opposite the laser 18 as the ionization front 24 reaches the end of the array 4. (For $\omega_p > k_o c$, as those terms are described below, the radiation 28 will exit through the window 15 at the opposite end of the array 4.) An output coupler 30 visible in FIGS. 1 and 2 within the vessel 6 at the end of the array 4 where the radiation 28 exits provides a smooth transition for directing the radiation 26 from the array 4 through the window 16. A typical coupler 30 comprises a tapered metal cone.

The wavelength of the output radiation 28 is determined by the spacing d (see FIG. 1) between the adjacent capacitors in the array 4 and by the density or pressure of the working gas 12. Wavelengths covering the full spectral range from microwaves on up (e.g., 1 cm–1 μm) are possible. Selective control of the output frequency is achieved by selectively varying the dispersive properties of the medium behind the conductive front, e.g., by varying the pressure of the working gas 12, or by varying the capacitor spacing d, thus providing tunability of the output frequency by as much as four orders of magnitude. In general, the larger the spacing or the higher the pressure, the lower is the output wavelength and the higher is the output frequency of the emitted radiation 28.

The power of the output radiation 28 can be controlled by the bias voltage $V_o$ (see FIG. 1) supplied across the capacitors in the array 4. Generally, the larger the bias voltage, the greater the output power. High power pulses of output radiation 28 can be obtained by pulsing the bias voltage $V_o$ across the capacitor plates 8.

To illustrate the potential of the apparatus, consider an array of thirty capacitors (2N, where N is the number of capacitor periods, which is half the number of capacitors) with plate separation $d \approx b \approx 2$ cm and a DC bias voltage $V_o$ of 30 kV. Eqs. (3) and (9) to be described below, predict radiation with peak power on the order of 1 MWatt (in a round spot), tunable from a wavelength of 1 cm to 1 μm by varying the neutral gas pressure from $10^{-4}$ to 1 Torr (for a doubly ionized gas, corresponding to $n_o = 6\times10^{12}$–$6\times10^{16}$ $cm^{-3}$). For an array 40 cm long, the radiation would have a fractional bandwidth $\Delta\lambda/\lambda \approx 10\%$.

A second example with a fairly small array structure that could be more readily ionized with a modest laser (mJoules) and that could be designed to operate in the 10–100 μm wavelength regime has $d \approx 300$ μm and an array length of about 1 cm for producing bursts of radiation in the range of 500–5 μm wavelength range with a pulse duration of about 50–0.5 picoseconds (or less) for gas pressures of 0.1 to 1 Torr, respectively.

While the above-described embodiment utilizes a laser source 18 for producing the ionization front, other types of ionization sources are possible, such as particle beam ionization or bursts of incoherent x-rays. In addition, since a coherent source is not essential, a flash lamp could be used as a less expensive way of producing the ionization front. The ionization source may, if desired, be directed from the side of the capacitor array 4 rather than being co-linear with the output radiation 28 as illustrated in FIG. 2. This feature is discussed in more detail in the "Theory of Operation" section which appears below. A solid state device rather than a gas-filled capacitor array also can be used.

Exemplary Applications

The radiation source 2 of FIGS. 1 and 2 can be used in a wide variety of applications, such as communications, advanced radar, medical applications and as a research tool. It is especially useful for producing short pulses of radiation in frequency ranges not normally accessible with lasers (e.g., 12–100μ wavelength). For example, it can be used to produce short pulses of radiation in the 100μ wavelength regime that are desirable for ultra-fast chemistry and band-structure studies in semi-conductor devices. For such applications, the radiation source 2 as depicted in FIG. 1 can be provided as an add-on component to hi-brightness lasers for extending the range of wavelengths that the laser may access.

The utility and versatility of the radiation source 2 also is enhanced by the fact that it has a broad range of tunability and control over the emitted radiation. Both the wavelength (or frequency) and its waveform (or shape) can be varied to achieve desired objectives. For example, the spacing between adjacent capacitors can be varied in places along the length of the array 4 to produce an arbitrary "chirp" or frequency versus time signature in the emitted radiation. Likewise, the bias voltage across the capacitors can be varied in places along the array 4 to produce arbitrary amplitude versus time signatures. The number of cycles in the radiation also can be varied by changing the effective number of capacitors in the array such as, for example, by removing the bias voltage across some of the capacitors. These capabilities are useful in advanced radar and in a wide variety of other applications.

The radiation source 2 also can be used to produce bursts of radiation having arbitrary signal coding. For example, missing wave periods or missing peaks can be encoded into the radiation pulse 28 by selectively deactivating the bias voltage across certain capacitors in the array 4. Such encoded signals are useful in a wide variety of communications applications.

While a linear array 4 is used with the exemplary source of FIG. 1, other types of arrays, such as a spiral array, are possible, expanding even further the potential forms of radiation that can be produced from the source.

A different approach involves upshifting existing electromagnetic radiation over a wide range of frequencies by propagating the radiation through a slow wave structure with a moving ionization front. A slow wave structure of conventional design can be used, and the ionization front may be produced, for example, by propagating a laser pulse through a pressurized gas contained within the structure in a manner similar creation of the ionization front in the capacitor array described above. Frequency upshifts of several orders of magnitude in the radiation emitted from the slow wave structure are possible with this approach. The amount of frequency change can be varied by changing the pressure of the gas or the velocity of the moving front, or by changing the geometry of the slow wave structure to control the speed of the radiation propagating through the structure.

Theory of Operation

In order to explain the basic mechanism of operation of the above-described embodiment, as it is presently understood, a simple one-dimensional description of the field structure between the capacitors in the array 4 will be described first. Then, the two-dimensional field structure will be taken into account in computing the amplitude of the output radiation 28.

In the one-dimensional description, the alternately biased capacitors produce a static electric field of the form $E \sim (E_o \sin k_o x)\, y$ in a working gas of density $n_o$, where $k_o = \pi/d$ and d is the spacing between adjacent capacitor plates and x and y define a plane of the static electric field. An ionization front created by the short laser pulse moves between the plates in the +x direction with velocity $v_f$. For a front created by a laser of frequency $\omega_L$, the front moves at the group velocity of the laser in the plasma, so the front velocity $v_f = c(1-\omega_p^2/\omega_L^2)^{1/2} \approx c$ and $\gamma_f = (1-v_f^2/c^2)^{-1/2} \approx \omega_L/\omega_p$, where $\omega_p = 4\pi n_o e^2/m$ is the plasma frequency of the ionized gas (where e is the charge of an electron, and m is the mass of an electron).

To describe the radiation generated, consider the situation in a reference frame moving with the ionization front. Since $v_f \approx c$, the Lorentz transformed electric field approximates an electromagnetic wave in the moving frame (i.e., $\omega' \approx k_o' c$, $B_o' \approx E_o'$, apostrophes denoting front frame quantities) of Doppler shifted frequency $\omega' = \gamma_f k_o v_f$. In this frame the front is static and the incident wave moves in the −x direction and gives rise to reflected (+x direction) and transmitted (−x direction) waves all at the same frequency ω'. The reflected wave will be an extremely short pulse of hard x-rays. The transmitted wave will be the tunable radiation.

The transmitted wave satisfies the dispersion relation in the plasma, i.e., $k'^2 c^2 = \omega'^2 - \omega_p^2$. Lorentz transforming w' and k' back to the lab frame gives the emitted frequency:

$$\omega = \gamma_f^2 k_o v_f \left[ 1 - \frac{v_f}{c} \left( 1 - \frac{\omega_p^2}{\gamma_f^2 k_o^2 v_f^2} \right)^{\frac{1}{2}} \right] \tag{1}$$

When $\omega' >> \omega_p$, namely $\omega_L >> \omega_p^2/k_o v_f$, this can be approximated as $$\omega \approx \frac{k_o v_f}{2} + \frac{\omega_p^2}{2 k_o v_f} \tag{2}$$

From this expression it can be seen that for a fixed gas density, ω has a minimum value of $\omega_p$ when $k_o = \omega_p/v_f$. High frequency can be obtained by employing capacitor arrays with either large $k_o$ (i.e., a microstructure) or small $k_o$ (macrostructure) compared to this value. For the macrostructure, tunability is achieved by varying the gas pressure since the output frequency is nearly linear in the density. For the macrostructure, the upper limit on the frequency is approximately the laser frequency $\omega_L$ and occurs for $\omega_p^2/2k_o c = \omega_L$. For larger $\omega_p$ the static field is reflected at the front.

The frequency of the transmitted radiation can also be obtained directly in the lab frame. The frequency follows from two conditions: (i) the plasma dispersion relation, and (ii) continuity conditions at the front boundary. The dispersion relation is $\omega^2 = \omega_p^2 + c^2 k^2$. For any of the fields to be continuous across the boundary, their phases must be the same at the front. The phase of the incident wave is $\pm k_o x$, while the phase of the transmitted wave is $(\omega t + kx)$. Equating these and using $x = v_f t$ at the position of the front gives the condition for phase continuity: $\omega + k v_f = k_o v_f$ for the mode of interest. Substituting for k from the latter equation into the dispersion equation and rearranging gives the result in Eq. (1) above.

Graphical solutions to the dispersion equation and continuous phase condition are plotted in FIG. 3, which depicts ω (2π times the output frequency of emitted radiation) versus k (2π/output frequency of emitted radiation). The dispersion curve illustrated in FIG. 3 represents the wave propagation properties of the plasma medium in the capacitor array 4. Radiation propagating through the plasma 22 falls on this curve. The line of constant phase comes from the requirement that all waves must have the same phase at the ionization front. The intersection of this line with the dispersion curve at point T1 gives the output frequency and wavelength of the emitted radiation 28. The point $k_o = 2\pi$/wavelength of the DC electric field 10 produced by the capacitor array 4. The frequency and wavenumber of the electric field is effectively upshifted from the point labeled $k_o$ to the point labeled T1.

FIG. 3 illustrates the case of $k_o < \omega_p/v_f$ (macrostructure). It can be seen that ω/k and ∂ω/∂k (i.e., the slope of the graph, where $\partial\omega/\partial k$ is the derivative of $\omega$ with respect to k) are negative at the intersection which indicates that the output (transmitted) radiation moves in the same direction as the front, namely, the +x direction. The output frequency is approximately $\omega_p^2/2k_oc$ for this case. If $k_o>\omega_p/v_f$ (microstructure), the constant phase line would intersect the dispersion curve in the other quadrant, indicating that the output (transmitted) radiation is in the opposite direction, i.e., in the −x direction or opposite to the laser front. The output frequency in this case is approximately $k_oc/2$ and is nearly independent of plasma density. Implicit in this result is the assumption that the plasma density is high enough to fully short out the capacitors' electric field. This requires $n_o>>E_o/8\pi eb$ and is easily satisfied.

For $k_o=\pi/d$; $\omega_p^2\propto P$ and $v_f\approx c$, the wavelength of the transmitted wave, expressed in terms of the geometry of FIG. 1, and derived from Eq. (2) above, is defined by the following relationship:

$$\lambda=16\ \mu m\ (1\ Torr/P)(1\ mm/d) \tag{3}$$

where P is the pressure of the working gas 12 and d is the spacing between the centers of adjacent capacitor plates 8.

The output power of the radiation can be estimated by finding the transmission and reflection coefficients at the ionization front boundary. First, determine the field structure for the "incident", reflected and transmitted fields in a two-dimensional model. For capacitors of half separation b and small gaps $\delta<<k_o^{-1}$, the fields between the plates are given by $$E_y=\sum_{n=0}^{\infty}\frac{(-1)^n 4k_oV_o}{\pi\sinh(2n+1)k_ob}e^{i(2n+1)k_ox}\cosh(2n+1)k_oy$$

$$E_x=\sum_{n=0}^{\infty}\frac{i(-1)^n 4k_oV_o}{\pi\sinh(2n+1)k_ob}e^{i(2n+1)k_ox}\sinh(2n+1)k_oy$$

Near the axis, the first term (n=0) in the sum is always the largest term by a factor of three or more, so only the first term is kept in the following analysis, i.e.

$$E_y=E_oe^{ik_ox}\cos h\ k_oy$$

$$E_x=iE_oe^{ik_ox}\sin h\ k_oy$$

where $$E_o=4k_oV_o/\pi\ \sin h(k_ob)=4V_o/d\ \sin h(\pi b/d)$$

The next step is to consider the mode structure for the transmitted waves in the plasma. In a two-dimensional model, the well known plasma dispersion relations are $\omega^2=\omega_p^2+c^2k_x^2+c^2k_y^2$ for transverse modes; $\omega^2=\omega_p^2$ for longitudinal modes; and $\omega=0$ for the free streaming mode. To assure continuity everywhere along the boundary, each transmitted mode is taken to have fields with the same transverse dependence as the incident fields: $E_x=E_x\ e^{(i\omega t+kx)}\sinh k_oy$ and $E_y=E_y\ e^{(i\omega t+kx)}\cosh(k_oy)$. The sinh and cosh terms Fourier decompose into an infinite number of $k_y$ components, and because of the dispersion relation for the transverse modes, each Fourier $k_y$ component would lead to a different $\omega$ and $k_x$. However, when $\omega_p>>ck_o$ (large upshifts), then the $c^2k_y^2$ term (of order $c^2k_o^2$) in the dispersion relation can be neglected, and the transmitted mode can be considered as having a single frequency.

The capacitor field has a longitudinal component ($E_x$), so it is expected to couple to the longitudinal modes in the plasma. Adding these two components to the dispersion diagram of FIG. 3, it can be seen that there is coupling to one transverse mode (T1) as well as two longitudinal modes (T2 representing the positive longitudinal plasma wave $\omega_p$ and T3 representing the negative longitudinal plasma wave $-\omega_p$) and a free streaming mode (TS representing the static magnetic field $\omega_o$). The form of the reflected and four transmitted modes are given in Table 1 below, where $\nabla\cdot E=0$ for the transverse mode, $\nabla\times E=0$ for the longitudinal mode and $\partial/\partial t=0$ for the streaming mode:

TABLE 1

Mode Structure of fields.

| mode | $E_x$ | $E_y$ | $B_z$ |
|---|---|---|---|
| incident (static) mode | $ie^{ik_0x}\sinh k_0y$ | $e^{ik_0x}\cosh k_0y$ | 0 |
| reflected mode | $-i\frac{k_0}{k_r}Re^{i(\omega_rt-k_rx)}\sinh k_0y$ | $Re^{i(\omega_1t-k_1x)}\cosh k_0y$ | $\left(k_r-\frac{k_0^2}{k_r}\right)\frac{c}{\omega_r}Re^{i(\omega_rt-k_rx)}\cosh k_0y$ |
| T1 mode | $i\frac{k_0}{k_1}T_ie^{i(k_1x-\omega_1t)}\sinh k_0y$ | $T_1\ e^{i(k_1x+\omega_1t)}\cosh k_0y$ | $\left(\frac{k_0^2}{k_1}-k_1\right)\frac{c}{\omega_1}T_i\ e^{i(k_1x+\omega_1t)}\cosh k_0y$ |
| T2,T3 mode | $i\frac{k_{2,3}}{k_0}e^{i(\omega_{2,3}t+k_{2,3}x)}\sinh k_0y$ | $T_{2,3}\ e^{i(\omega_{2,3}t+k_{2,3}x)}\cosh k_0y$ | 0 |
| TS (free streaming) mode | 0 | 0 | $T_s\ e^{ik_sx}\cosh k_0y$ |

The determination of the coefficients $T_1$, $T_2$, $T_3$, $T_s$, and R involves five boundary conditions. In addition to the usual conditions that $E_{tangential}$ and $B_{tangential}$ be continuous, three more conditions follow from the fact that electrons are born at rest with no velocity at the moment they are ionized. As a result $j_y=0$, $j_x=0$ and $\rho_s=0$ at the front. The complete set of boundary conditions that follow from these and Faraday's and Gauss' laws are continuity of (1) $E_y$, (2) $B_z$, (3) $\partial B_z/\partial x+1/c\ \partial E_y/\partial t$ (=0), (4) $\partial B_z/\partial y-1/c\ \partial E_x/\partial t$ (=0), and (5) $E_x$. Applying these to the fields in Table 1 yields five equations that can be solved for the five unknown coefficients for arbitrary $\beta$ and $\omega_p/k_oc$. For relativistic fronts ($\beta\approx1$) and large upshifts ($\omega_p/k_oc>>1$), the coefficients can be approximated as $$R\approx4\omega_p^2/\gamma_f^2\beta^2k_0^2c^2 \tag{4}$$

$$T_1\approx1+2(k_oc/\omega_p)^2 \tag{5}$$

$$T_2\approx-k_oc/2\omega_p(1+2k_oc/\omega_p) \tag{6}$$

$$T_3 \approx k_o c / 2\omega_p (1 - 2k_o c/\omega_p) \quad (7)$$

$$T_s \approx -1 \quad (8)$$

Thus, the output radiation amplitude (T1) is approximately equal to the DC capacitor field $E_o$. The peak power can be expressed in terms of the geometry of FIG. 1, as follows:

$$\text{Peak Power} = cE_o^2 d^2/8\pi = 1.2\ \text{kW}(V/1\ \text{kV})^2 \quad (9)$$

where V is the voltage across the capacitor array 4.

An advantage of using the DC capacitor array over previous schemes based on upshifting existing radiation is that it may be possible to achieve higher output power by pulsing the DC bias voltage on a nanosecond time scale. For such short bias pulses, much higher incident wave fields can be established without suffering breakdown than is possible by propagating a microwave through gas.

Since the number of cycles of output radiation is roughly equal to the number of cycles of the static field, the pulse length, bandwidth and efficiency can be estimated from the geometry. The pulse length is $\tau_{pulse} \approx N\lambda/c = 2\pi N/\omega_1$, where N is the number of capacitor periods (half the number of capacitors) and $\lambda$ is the output wavelength. Expressed in terms of the geometry of FIG. 1, the pulse duration ($\tau$) is as follows:

$$\tau = N\lambda/c = 50\ f\text{sec}\ N(1\ \text{Torr}/P)(1\ \text{mm}/d) \quad (10)$$

where d is the spacing between the centers of adjacent capacitor plates 8.

Control of the number of cycles and the creation of wavetrains encoded with missing peaks can be accomplished by connecting or disconnecting some of the capacitors from the DC bias supply. The bandwidth scales as $\Delta\omega/\omega \approx 1/N$, while the efficiency is $\eta = (2k_o^2c^2/\omega_p^2)$, where $\eta$ is the ratio of the AC energy in the output (transmitted) pulse to the DC energy in the ionized volume.

The above analysis is strictly valid only for sharp fronts. The condition for a sharp front is that the scale length of the front $L_f$ be much less that $(\gamma_f^2 k_0)^{-1}$. However, the frequency of the output radiation is unchanged as long as the front is shorter than $C\tau_{pulse}$, the duration of the output pulse. It can now be shown that the transmission coefficient is unchanged for continuous fronts. First, introduce the spatial-temporal analog of a WKB approximation (a mathematical method of approximation named after Wentzel, Kramers and Brillouin, who first applied the method to quantum mechanical probems). Then, assume that the wave's amplitude (A) depends on the distance that it has propagated through the front (i.e., it is a function of $x - v_f t$) so that $$E_y(x,y,t) = A(x - v_f t)e^{i(kdx + \omega dt)} \cos h\ k_o y \quad (11)$$

where $\omega \approx \omega_p^2(x - v_f t)/2k_o c$ is the local upshifted frequency and $k = k(x - v_f t) \approx ck_o - \omega_p^2(x - v_f t)/2k_o c$. Substituting this form of the solution into the lab frame wave equation $(\partial^2/\partial x^2 + \partial^2/\partial y^2 - 1/c^2\partial^2/\partial t^2)\ E = \omega_p^2(x - v_f t)/c^2\ E$ and neglecting terms of order $k' + \beta\omega'/c$ compared to $(k + \beta\omega/c)^2$ where ' denotes derivatives with respect to $x - v_f t$ yields the first order differential equation $A'2(k + \beta\omega/c) + A\ (k' + \beta\omega'/c) \approx 0$, with solution $$A = E_o \frac{\sqrt{k_o}}{\sqrt{k + \beta\omega/c}} = E_o \left( \frac{\beta}{1 - \omega/\gamma_f^2 k_o c} \right)^{\frac{1}{2}} \approx E_o \quad (12)$$

Thus, the continuous front transmission coefficient is approximately 1, just as for a sharp front. The reflected mode, although upshifted to even higher frequencies and more pulse compressed than the transmitted mode ($\omega \approx 2\gamma_f^2 k_o c$, possibly yielding hard x-rays), has an extremely small amplitude coefficient for continuous fronts. On the other hand, the amplitude of the free streaming mode $T_s$ is unchanged unless $L_f > k_o^{-1}$.

Particle-in-cell simulations conducted with sharp and continuous fronts bear out the general conclusions discussed above. The simulations were done on a two-dimensional grid of length $5\pi/k_o$ and half-width $k_o b = 1.38$, with the front moving to the right at $\beta = 0.99999$. The gas density was chosen such that $\omega_p/k_o c = 5.64$ giving a predicted upshift factor of $\omega_p^2/2k_o^2c^2 = 16$.

FIG. 4 shows a snapshot of the magnetic field $B_z$ along the reference x-axis of FIG. 1. $B_z/E_o$ is represented by the solid line and plasma density $\eta/\eta_{max}$ is represented by the dashed line. The short wavelength oscillations are the upshifted and pulse compressed radiation (T1) following the front to the right. The longer wavelength oscillation to the left is the free streaming mode (TS). The amplitude coefficients of the transverse mode and free streaming mode are approximately one, and the wavelength (and pulse length) is shortened by a factor of 16 in agreement with the theoretical prediction.

It is noted that the various frequency upshift schemes involving ionization fronts in unbounded plasmas, plasmas in fast wave structures and slow wave structures with either counter- or co-propagating incident fields can be unified by the single equation of continuity of phase at the front: $\omega_o \pm k_o v_f = \omega \pm k v_f$ or $$\frac{\omega}{\omega_o} = \frac{1 \pm v_f/v_{\phi o}}{1 \pm v_f/v_{\phi up}} \quad (13)$$

where $v_{\phi o} = \omega_o/k_o$ and $v_{\phi up} = \omega/k$ and the + (−) sign corresponds to radiation moving opposite (toward) the front. From this it is apparent that very large upshifts are possible in two ways: (1) the numerator will be large if $v_{\phi o} << v_f$, i.e., a very slow wave structure, and (2) the denominator can be large if $v_f$ is equal to $v_{\phi up}$, that is, if the phase velocity of the upshifted wave is matched to the front velocity. The latter condition would involve slowing down the upshifted light's phase velocity (typically greater than c) or superluminous fronts ($v_f > c$) such as may be created by sweeping the ionizing laser from the side.

From the foregoing, it will be appreciated that the radiation generating method and apparatus of the present invention provides bursts of high-power radiation of variable duration, frequency and shape, tunable over several orders of magnitude, and does so with a simple, compact and inexpensive device. Further, the method and apparatus provide the ability to produce arbitrary forms of radiation with selected signatures and signal encoding, useful in a wide range of applications.

While several particular forms of the invention have been illustrated and described, it will be apparent that various modifications can be made without departing from the spirit and scope of the invention. Accordingly, it is not intended that the invention be limited, except as by the appended claims.

What is claimed is:

1. Method for generating radiation, comprising the steps of:

producing a static DC electric field configuration; and propagating a conductive front of plasma through said electric field to cause selective discharge of current through said field, said selective discharge of current generating electromagnetic radiation behind said front which is emitted from said field.

2. Method as set forth in claim 1, further comprising the step of selecting the wavelength of said emitted electromagnetic radiation by selectively varying dispersive properties of a medium behind the conductive front of said DC electric field configuration.

3. Method as set forth in claim 2, wherein said step of selecting the wavelength of said emitted electromagnetic radiation comprises selecting said wavelength to be within the range of about 1 cm–1 μm.

4. Method as set forth in claim 1, further comprising the step by selecting the peak power of said emitted electromagnetic radiation by selectively varying the amplitude of said DC electric field configuration.

5. Method as set forth in claim 4, wherein said static DC electric field configuration is produced by a bias voltage, and said step of producing said static DC electric field configuration comprises pulsing said bias voltage to increase said peak power of said emitted electromagnetic radiation.

6. Method as set forth in claim 1, where in said step of propagating a conductive front comprises propagating an ionization front in an ionized plasma.

7. Method as set forth in claim 1, wherein said step of producing said static DC electric field configuration comprises producing said static DC electric field configuration within a gas-filled capacitor array, and said step of propagating a conductive front comprises propagating a pulse of visible radiation through said array which ionizes said gas and produces a phased discharge current across said array, resulting in the emission of said electromagnetic radiation from said array.

8. Method as set forth in claim 7, wherein said step of propagating visible radiation comprises propagating laser radiation.

9. Method as set forth in claim 8, wherein said step of producing a static DC electric field configuration comprises filling said capacitor array with pressurized gas.

10. Method as set forth in claim 9, further comprising the step of selecting the wavelength of said emitted electromagnetic radiation by selectively varying dispersive properties of said gas behind said conductive front.

11. Method as set forth in claim 9, further comprising the step of selecting the wavelength of said emitted electromagnetic radiation by selectively varying said pressure of said gas.

12. Method as set forth in claim 11, wherein said step of varying said pressure of said gas comprises varying said pressure within the range of about 0.1 milliTorr–10 Torr.

13. Method as set forth in claim 7, wherein said step of producing said static DC electric field configuration within said capacitor array comprises producing said static DC electric field configuration with multiple, spaced-apart capacitors, and further comprising the step of selecting the wavelength of said emitted electromagnetic radiation by selectively varying the spacing between said capacitors.

14. Method as set forth in claim 1, wherein said step of producing said static DC electric field configuration comprises varying an amplitude of a DC electric field throughout said DC electric field configuration field.

15. Method as set forth in claim 14, wherein said step of varying an amplitude comprises varying said amplitude in undulating fashion.

16. Method as set forth in claim 14, further comprising the step of altering the amplitude of said variations in selected regions of said DC electric field for generating said emitted radiation with a selected amplitude versus time signature.

17. Method as set forth in claim 14, further comprising the step of altering the spatial frequency of said amplitude variations in selected regions of said DC electric field for generating said emitted radiation with a selected frequency versus time signature.

18. Method as set forth in claim 14, further comprising the step of reducing said amplitude variations to zero in selected regions of said DC electric field for generating said emitted radiation encoded with missing wave periods.

19. Method as set forth in claim 1, further comprising the step of selecting the duration of said emitted electromagnetic radiation by selectively varying the amount of time that said conductive front propagates through said electric field.

20. Method as set forth in claim 1, further comprising the step of selecting the waveform of said emitted electromagnetic radiation by selectively varying the waveform of said DC electric field configuration.

21. Method as set forth in claim 1, wherein said step of producing said DC electric field configuration comprises producing an electric potential within the range of about 1–30 kV.

22. Method as set forth in claim 1, further comprising the step of selecting a pulse length of said emitted electromagnetic radiation by selectively varying the number of cycles of said DC electric field configuration.

23. Method as set forth in claim 22, wherein said step of producing said DC electric field configuration comprises producing said DC electric field configuration by an array of charged capacitors, and varying said pulse length of said emitted electromagnetic radiation by selectively removing the charge from one or more of said capacitors in the array.

24. Apparatus for generating radiation, comprising:

means for producing a static DC electric field configuration; and means for propagating a conductive front of plasma through said electric field to cause selective discharge of current through said field, said selective discharge of current generating electromagnetic radiation behind said front which is emitted from said field.

25. Apparatus for generating radiation, comprising:

a gas-filled capacitor array;

a DC bias voltage applied to said array to produce a static DC electric field within said array; and a laser source for propagating laser radiation pulses through said electric field to ionize said gas within said array and produce a phased discharge current across said array, said current generating electromagnetic radiation which is emitted from said array.

26. Apparatus as set forth in claim 25, wherein said capacitor array comprises a plurality of adjacent capacitors, each of said capacitors including a respective pair of spaced-apart, opposed capacitor plates with pressurized gas disposed therebetween.

27. Apparatus as set forth in claim 26, wherein said pressurized gas is selected from the group consisting of azulene, diethyl aniline, hydrogen, helium and carbon monoxide.

28. Apparatus as set forth in claim 26, wherein said capacitors in said capacitor array have centers which are respectively separated from each other by a distance of about 4.7 cm to 300μ.

29. Apparatus as set forth in claim 28, wherein said capacitor array comprises 1–100 capacitors.

30. Apparatus as set forth in claim 26, wherein adjacent capacitors in said array are oppositely polarized.

31. Apparatus as set forth in claim 25, wherein said laser source is selected from the group consisting of Nd:Glass, Nd:Yag, and Ti:Sapphire lasers.

32. Apparatus as set forth in claim 25, wherein said laser source produces radiation with a wavelength in the range of about 0.25μ–1.0μ.

33. Apparatus as set forth in claim 32, wherein said laser source produces radiation with a pulse length in the range of about 0.2 mm to 15 mm.

34. Apparatus as set forth in claim 25, wherein said DC bias voltage is in the range of about 1–30 kV.

* * * * *

UNITED STATES PATENT AND TRADEMARK OFFICE

CERTIFICATE OF CORRECTION

PATENT NO. : 5,780,971

DATED : Jul. 14, 1998

INVENTOR(S) : John M. Dawson, Warren B. Mori, Chih-Hsiang Lai, Thomas C. Katsouleas It is certified that error appears in the above-identified patent and that said Letters Patent is hereby corrected as shown below:

Column 3, Line 27, after "as", add --is--.

Column 4, Line 25, within the parenthesis, delete "see FIG. 1", add --not shown--.

Signed and Sealed this

Fifth Day of January, 1999

*Attest:*

Q. Todd Dickinson

*Attesting Officer*

*Acting Commissioner of Patents and Trademarks*

UNITED STATES PATENT AND TRADEMARK OFFICE

CERTIFICATE OF CORRECTION

PATENT NO. : 5,780,971

DATED : Jul. 14, 1998

INVENTOR(S) : John M. Dawson, Warren B. Mori, Chi-Hsiang Lai, Thomas C. Katsouleas It is certified that error appears in the above-identified patent and that said Letters Patent is hereby corrected as shown below:

Title page, under "Assignees:" after "Regents of the", delete "Univ." first occurrence.

Signed and Sealed this

First Day of August, 2000

Attest:

Q. TODD DICKINSON

*Attesting Officer*

*Director of Patents and Trademarks*

UNITED STATES PATENT AND TRADEMARK OFFICE

CERTIFICATE OF CORRECTION

PATENT NO. : 5,780,971

DATED : Jul. 14, 1998

INVENTOR(S) : John M. Dawson, Warren B. Mori, Chi-Hsiang Lai, Thomas C. Katsouleas It is certified that error appears in the above-identified patent and that said Letters Patent is hereby corrected as shown below:

Title page, under "Assignees:" after "Regents of the", delete "Univ." first occurrence.

Signed and Sealed this

Thirtieth Day of January, 2001

*Attest:*

Q. TODD DICKINSON

*Attesting Officer*

*Director of Patents and Trademarks*